United States Patent [19]

Patel

[11] 4,055,806
[45] Oct. 25, 1977

[54] INTEGRATED CIRCUIT SUBSTITUTION DEVICE

[76] Inventor: Harshad M. Patel, 743 E. Duane Ave., Sunnyvale, Calif. 94086

[21] Appl. No.: 651,732

[22] Filed: Jan. 23, 1976

[51] Int. Cl.$^2$ ................... G01R 31/22; G01R 31/02
[52] U.S. Cl. ............................. 324/158 F; 324/73 R; 339/176 P
[58] Field of Search ............ 324/158 F, 158 P, 158 R, 324/73 R; 339/176 M, 176 P, 17 CF

[56] References Cited

U.S. PATENT DOCUMENTS 3,882,386  5/1975  Vinsani ............................. 324/73 R Primary Examiner—Rudolph V. Rolinec
Assistant Examiner—Ernest F. Karlsen
Attorney, Agent, or Firm—Robert D. Farkas

[57] ABSTRACT

This disclosure pertains to an integrated circuit substitution device comprising a pincer-like contacting assembly which connects to the terminals of an existing integrated circuit connected to external circuitry, to be evaluated utilizing substitutional techniques. The contacting assembly is adapted to connect to an integrated circuit socket with a one to one correspondence with all the terminals of the questionable integrated circuit and the substituted integrated circuit with the exception of one or more vital connections, thus permitting the substituted integrated circuit to be passively inserted in the circuit. When the missing connection is completed manually, the substituted integrated circuit becomes active.

4 Claims, 3 Drawing Figures

INTEGRATED CIRCUIT SUBSTITUTION DEVICE

BACKGROUND OF THE INVENTION

1. The Field of the Invention

This invention relates to electronic testing apparatus and more particularly to that class of devices adapted to evaluate the performance of integrated circuits utilizing substitutional techniques.

2. Description of the Prior Art

The prior art requires removal and complete replacement of suspected integrated circuits as the accepted method of evaluating integrated circuits that are suspected of being defective. Some devices are available which facilitate convenient "snap-on" of electrical probes to the device which clips on the individual integrated circuits. The existing suspected integrated circuit is left in the circuit and is fully functional during the time that the evaluation takes place.

SUMMARY OF THE INVENTION

The invention comprises a clip on device adapted to engage all but one or more of the exposed terminal connections of an existing integrated circuit. Each of the engaged terminals are connected to a substitution integrated circuit socket having an equal number of terminals as the existing suspected integrated circuit. A working comparison integrated circuit whose operational characteristics match the suspected integrated circuit is inserted in the substitution socket. The comparison integrated circuit remains passive because of the failure to complete a vital ground or imput terminal connection from the terminals of the suspected integrated circuit to the terminals of the comparison integrated circuit. The user may study the operation of the overall circuit when the comparison is passive, or, by completing the missing connection when the comparison is active, thereby eliminating external feedback loops and extraneous signals as desired.

A primary object of the instant invention is to provide a convenient inexpensive clip on device to substitute an unknown quality integrated circuit with a known quality integrated circuit.

Another object is to provide a means of rapidly installing a working integrated circuit in a passive mode into existing electronic devices.

Still another object is to provide a means to selectively activate or de-activate a substituted integrated circuit.

A further object is to provide a means to utilize one testing apparatus which accommodates a wide variety of integrated circuits.

Another object is to provide a testing device which permits an integrated circuit to be evaluated without removal from its installed position in existing electronic equipment.

Still another object is to provide an integrated circuit substitution device facilitating convenient access to the terminals of the substituted integrated circuit.

These objects, as well as other objects of this invention, will become readily apparent after reading the following description of the accompanying drawings.

DESCRIPTION OF THE PREFERRED EMBODIMENT

The structure and method of fabrication of the present invention is applicable to a pincer-like device comprising two lateral rectangular plates that are pivotably connected to each other. The axis of the pivot is intermediate two opposed lateral surfaces thereof and is located intermediate the two ends of the rectangular plates perpendicular to the longitudinal edges thereof. An expansion helical spring is installed in touching engagement with each opposing lateral face intermediate the pivot axis and one free end. The other free ends are adapted with a plurality of exposed contacts on the opposed surfaces of the plate. Each contact on one surface is electrically connected to an integrated circuit socket utilizing rigid conductors. The contacts on the other surface are electrically connected to the remaining contacts on the integrated circuit socket utilizing flexible conductors. The exposed contacts on the edge of each test surface are uniformly spaced and designed to match the number of contacts available at the terminals of the suspected integrated circuit with the exception of one or more missing contacts. Each existing contact electrically connects to the corresponding terminals of the integrated circuit test socket. Wires extend from the integrated circuit test socket to the plates and terminate therein without being connected to the existing integrated circuit in the case of a missing contact. This permits convenient access to manually complete the circuit from the input terminal of the substituted integrated circuit to the input terminal of the suspected integrated circuit to which its external input lines are connected, or to the external input lines that have been disconnected from the suspected integrated circuit input terminals.

Application of compressive forces to the external surfaces of each plate results in the contact edges moving further apart permitting the user thereby to straddle the exposed terminals of the suspected integrated circuit. Release of the compressive forces insures good electrical contact to all of the exposed terminals save the terminal to which no connection is made. The edge of the plate is knotched in the area surrounding the space of a missing contact, facilitating access to the wire feeding the suspected integrated circuit input terminal and the wire which is connected to it.

Figure 1:
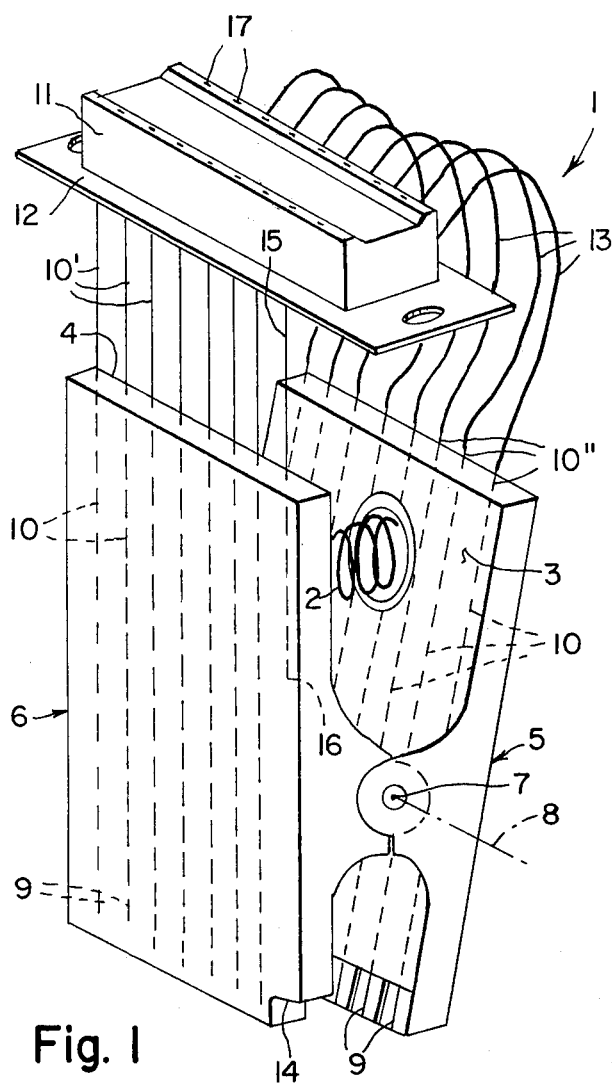
FIG. 1 is a perspective view of the integrated circuit substitution device.

Now referring to the Figures, and more particularly to the embodiment illustrated in FIG. 1 showing the integrated circuit substitution device 1 having an expansion helical spring 2 adapted to engage the inner surfaces 3 and 4 of plates 5 and 6. Pivot 7 pivotably fastens plates 5 and 6 together along a pivot axis line 8. Contacts 9 are installed at the lowestmost edge of the innermost surfaces of plates 5 and 6. Wires 10 extend through plates 5 and 6 and connect to contacts 9. Rigid wires 10' connect to one row of terminals of integrated circuit test socket 11 mounted to a printed circuit board 12. The free end of wires 10" are connected to one end of flexible wires 13 whose other end is connected to the other row of terminals of integrated circuit test socket 11. Knotch 14 is located at a site of a missing contact.

Wire 15 terminates at point 16 before completing its course to the knotch 14. One or more knotches may be located at one or more points along the two rows of contacts 9, as desired. The substitute comparison integrated circuit, not known, is inserted into the socket opening 17 of test socket 11. External connections may be made from the terminal of the suspected integrated circuit, not shown, appearing at knotch 14 to wire 15, or when desired, external connections may be made from wire 15 to the input line feeding the input terminal appearing at knotch 14 when the input line is disconnected from the input terminal of the suspected integrated circuit.

Figure 2:
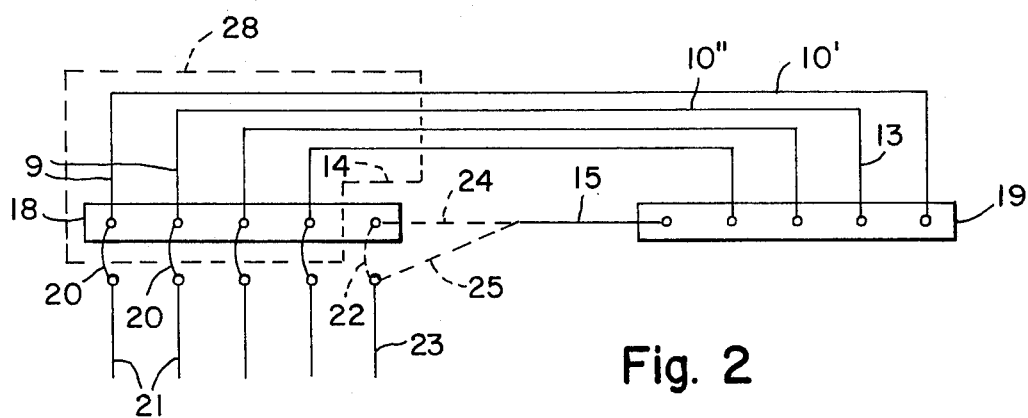
FIG. 2 is an electrical schematic representing an installed integrated circuit to which the integrated circuit substitution device is connected.

FIG. 2 illustrates the suspected integrated circuit 18 to which the terminals of contacts 9 are connected. Rigid wires 10' and 10" and flexible wires 13 connect to the substituted integrated circuit 19. Pins 20 of suspected integrated circuit 18 are installed to connect wires 21 which are part of the existing electronic circuitry, not shown. Wire 15 terminates before completing its connection to pin 22. Connecting wire 23 is illustrated connected to pin 22. An external jumper 24, shown in dotted lines, may complete, when desired, the input signal connection between existing suspected integrated circuit 18, input pin 22, and wire 15 which is connected to the input terminal of the substituted integrated circuit 19. Alternatively, external wire 25, shown in dotted lines, may complete, when desired, the input signal connection between existing suspected integrated circuit 18, input signal line 23, and wire 15 which is connected to the input terminal of the substituted integrated circuit 19, with or without input pin 22 making electrical contact with input signal line 23. Dotted lines 28 illustrate the edges of plate 6, not shown, in which knotch 14 is located, circumventing the zone surrounding input pin 22.

Figure 3:
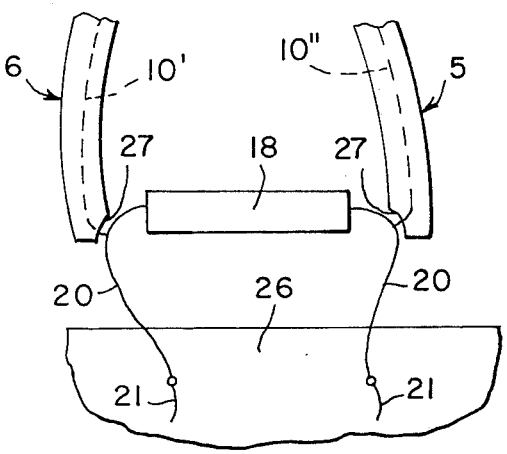
FIG. 3 is a partial elevation view of the integrated circuit substitution device connected to an existing installed integrated circuit.

FIG. 3 illustrates a portion of plates 5 and 6 connected to the suspected integrated circuit 18 at the existing pins 20, which are in turn connected to connecting wires 21 as part of the substrate 26 forming the electronic apparatus to be tested. Wires 10' and 10" are concealed within plates 5 and 6 and are exposed at edges 27 insuring contact thereby with pins 20.

One of the advantages is a convenient inexpensive clip on device to substitute an unknown quality integrated circuit with a known quality integrated circuit.

Another advantage is a means of rapidly installing a working integrated circuit in a passive mode into existing electronic devices.

Still another advantage is a means to selectively activate or de-activate a substituted integrated circuit.

A further advantage is a means to utilize one testing apparatus which accommodates a wide variety of integrated circuits.

Another advantage is a testing device which permits an integrated circuit to be evaluated without removal from its installed position in existing electronic equipment.

Still another advantage is an integrated circuit substitution device facilitating convenient access to the terminals of the substituted integrated circuit.

Thus, there is disclosed in the above description and in the drawings, an embodiment of the invention which fully and effectively accomplishes the objects thereof. However, it will become apparent to those skilled in the art, how to make variations and modifications to the instant invention. Therefore, this invention is to be limited not by the specific disclosure herein, but only by the appending claims.

The embodiment of the invention in which an exclusive privilege or property is claimed are defined as follows:

I claim:

1. An integrated circuit substitution device comprising a princer-like clip on probe having a plurality of engaging contacts arranged in two rows, means to bias said two rows of contacts towards each other normal to the opposed surface intermediate a pair of probe plates, each of said rows to contacts exposed upon a contact edge of said opposed surfaces, the contacts in one of said rows of contacts rigidly electrically connected with rigid connectors to a first row of terminals of an integrated circuit test socket, the contacts in the other row of said contacts flexibly electrically connected with flexible conductors to a second row of terminals of said integrated circuit test socket, the sum of all of said terminals of said integrated circuit test socket exceeding the sum of all of said contacts in both of said rows of contacts, a notch, said notch being located in said contact edge of said opposed surfaces adjacent to one of said contacts whose width is greater than the width of any of said contacts and less than the distance intermediate adjacent edges of a pair of said contacts.

2. The integrated circuit substitution device as claimed in claim 1 wherein said bias means comprises a helical expansion spring fixedly secured to said opposed surfaces intermediate said plates at a point intermediate a pivot axis and one edge of one of said plates, said pivot axis located intermediate said helical expansion spring and said edge extending parallel to said edge, means to pivotably secure said plates to each other about said pivot axis, said plates having generally equidimensioned rectangular shapes whose lateral surfaces are generally juxtaposed, spaced apart a fixed distance at a line passing through said pivot axis normal to one of said opposed surfaces.

3. The integrated circuit substitution device as claimed in claim 1 wherein said rigid conductors are electrically uninsulated for a portion of their lengths.

4. The integrated circuit substitution device as claimed in claim 1 wherein said flexible conductors are electrically uninsulated for a portion of their lengths.

* * * * *